(12) United States Patent
Boudon et al.

(10) Patent No.: US 7,661,039 B2
(45) Date of Patent: Feb. 9, 2010

(54) SELF-SYNCHRONIZING BIT ERROR ANALYZER AND CIRCUIT

(75) Inventors: Gerard Boudon, Mennecy (FR); Didier Malcavet, Champceuil (FR); David Pereira, Lisses (FR); Andre Steimle, Evry (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/154,188

(22) Filed: May 21, 2008

(65) Prior Publication Data
US 2009/0019326 A1   Jan. 15, 2009

Related U.S. Application Data

(63) Continuation of application No. 11/164,690, filed on Dec. 1, 2005, now Pat. No. 7,404,115.

(30) Foreign Application Priority Data
Feb. 12, 2004   (EP)   ................................. 04300840

(51) Int. Cl.
*G06F 11/00* (2006.01)
(52) U.S. Cl. .................... 714/707; 714/715; 714/43; 714/56; 714/704; 714/709; 714/716; 714/717; 714/724; 714/728; 714/731; 714/732; 714/734; 714/739; 714/744; 714/748; 714/712

(58) Field of Classification Search ................ None
See application file for complete search history.

(56) References Cited

U.S. PATENT DOCUMENTS

| | | | | | |
|---|---|---|---|---|---|
| 4,667,327 | A | * | 5/1987 | Bright et al. | 714/798 |
| 4,747,105 | A | * | 5/1988 | Wilson et al. | 714/707 |
| 4,754,457 | A | * | 6/1988 | Bright et al. | 714/798 |
| 4,975,640 | A | * | 12/1990 | Lipp | 714/734 |
| 5,228,042 | A | * | 7/1993 | Gauthier et al. | 714/716 |
| 5,412,665 | A | * | 5/1995 | Gruodis et al. | 714/739 |
| 6,560,727 | B1 | * | 5/2003 | Pierson et al. | 714/704 |
| 6,636,994 | B1 | * | 10/2003 | Waschura et al. | 714/704 |
| 6,684,358 | B1 | * | 1/2004 | Rajski et al. | 714/739 |
| 6,873,939 | B1 | * | 3/2005 | Zerbe et al. | 702/189 |
| 7,360,127 | B2 | * | 4/2008 | Zerbe et al. | 714/715 |
| 2005/0066244 | A1 | * | 3/2005 | Jas et al. | 714/732 |

* cited by examiner

*Primary Examiner*—John P Trimmings
(74) *Attorney, Agent, or Firm*—Joseph P. Abate; Daryl K. Neff

(57) ABSTRACT

A self-synchronizing data bus analyzer is provided which can include a generator linear feedback shift register (LFSR) to generate a first data set, and can include a receiver LFSR to generate a second data set. The data bus analyzer may also include a bit sampler to sample the first data set received through a data bus coupled to the generator LFSR and output a sampled first data set. A comparator can be included to compare the sampled first data set with the second data set generated by the receiver LFSR and provide a signal to the receiver LFSR to adjust a phase of the receiver LFSR until the second data set is substantially the same as the first data set.

13 Claims, 13 Drawing Sheets

SELF-SYNCHRONIZING BIT ERROR ANALYZER AND CIRCUIT

CROSS REFERENCE TO RELATED APPLICATION

This application is a continuation of U.S. application Ser. No. 11/164,690 filed Dec. 1, 2005 now U.S. Pat. No. 7,404,115, the disclosure of which is incorporated herein by reference.

TECHNICAL FIELD

The present invention relates to a self-synchronising bit error analyser and circuit therefor device capable of determining the bit error rate of single data rate (SDR) and double data rate (DDR) data.

BACKGROUND

The present invention provides a mechanism of assessing the performance of high-speed data buses. Accordingly, it is useful at this point to briefly review such data buses and the techniques that are currently used for assessing their performance. These topics will be discussed with reference to the accompanying figures in which:

FIG. 1 is a block diagram of a typical receiver in a hybrid parallel-serial interface; and FIG. 2 is a block diagram of a typical bit error testing device.

Modern software products (such as streaming video/audio etc.) have contributed to the ever-increasing demand for higher bandwidth data buses. High-speed data buses such as PCI-express, Hype Transport and RapidIO are replacing the traditional parallel PCI bus with a point-to-point communications system in which addressing information is packaged together with data and the resulting packets are transmitted over serial transmission lines. More recently, hybrid parallel-serial interfaces have been developed in which data is transmitted over multiple serial transmission lines operating in parallel.

Referring to FIG. 1, a receiver 10 in a hybrid parallel-serial interface typically comprises a differential I/O buffer 12, a clock and data recovery (CDR) circuit 14, a deserialiser or rate reduction block (DDR, QDR or ODR) 16, a deskewer 18 and a re-timing buffer 20. Since a timing signal is not generally transmitted in the data stream to a receiver, a CDR circuit 14 is used to regenerate a bit clock from the received data stream. Since individual serial transmission lines may have different time delays (because they are of different lengths etc.), the deskewer 18 is used to re-align data transmitted in parallel over multiple serial transmission lines. Finally, a reference clock 22 is used to control the timing of the CDR circuit 14, the deserialiser 16, deskewer 18 and the re-timing buffer 20.

Data transmitted at a double data rate (DDR) undergoes a transition at every clock edge. In other words, the data undergoes a transition at a rising clock edge and a falling clock edge. In contrast, data transmitted at a single data rate (SDR) undergoes a transition at every second clock edge (i.e. on either a rising clock edge or a falling clock edge).

The goal of a receiver in a digital data transmission system is to sample a received waveform at the point where its voltage and timing margins are as large as possible in order to minimize the risk of assigning an incorrect bit value to the sample. However, the increased data rates accommodated by high-speed data buses tend to accentuate irregularities in the signal stream. Furthermore, hardware analogue effects become more evident at higher data rates. Consequently, precise signal timing becomes more critical at higher data rates. One of the key metrics for quantifying the performance of a data transmission system is bit error rate (BER).

Referring to FIG. 2, a bit error testing circuit/device 40 typically comprises generator module 42 and a receiver module 44 which are respectively connectable to a transmitter $T_x$ and a receiver $R_x$. The transmitter $T_x$ is connected to the receiver $R_x$ through data bus 46. The generator module 42 comprises a first test pattern generator $LFSR_{GEN}$ and the receiver module 44 comprises a second test pattern generator $LFSR_{REC}$, comparator 48 and counter 50.

In use, the first test pattern generator $LFSR_{GEN}$ transmits a pre-defined test pattern $PRBS_{GEN}$ to the transmitter $T_x$. The transmitter $T_x$ then transmits the test pattern through the data bus 46 to the receiver $R_x$. The receiver $R_x$ samples the bits from the received waveform and transmits the resulting bit sequence to the comparator 48. The second test pattern generator $LFSR_{REC}$ generates a confirmation pattern $PRBS_{REC}$ that matches the test pattern $PRBS_{GEN}$ generated by the first test pattern generator $LFSR_{GEN}$. The second test pattern generator $LFSR_{REC}$ transmits the confirmation pattern $PRBS_{REC}$ to the comparator 48, which compares the confirmation pattern $PRBS_{REC}$ to the bit sequence received from the receiver $R_x$. The bit error rate is calculated as the number of bits that differ between the confirmation pattern $PRBS_{REC}$ and the bit sequence sampled from the waveform received by the receiver.

A pseudo-random bit sequence (PRBS) is a widely used test pattern for assessing bit error rates (BER). A PRBS is a particularly useful test pattern as it is an algorithmically determined, predictable and repeatable bit sequence that has the same statistical characteristics as a random sequence. These statistical characteristics mean that a PRBS can be readily used to simulate live traffic on a transmission line.

A PRBS can be generated by a linear feedback shift register (LFSR), in which some of the outputs from the register are fed back to its input through an XOR logic gate. By selecting different register lengths and feedback outputs it is possible to generate different output patterns. In particular, by correctly choosing the feedback outputs from an n-bit LFSR it is possible to generate a PRBS of length $2^n-1$, i.e. a maximal length sequence that includes all the possible permutations (patterns) of the n-bits, excluding the all-zeros pattern.

In light of the above discussion of PRBS test patterns and referring back to FIG. 2, for the sake of clarity the first test pattern generator $LFSR_{GEN}$ will be known henceforth as the generator LFSR. In addition, the test pattern $PRBS_{GEN}$ generated by the generator LFSR will be known henceforth as the generator PRBS. Similarly, the second test pattern generator $LFSR_{REC}$ and confirmation pattern $PRBS_{REC}$ generated therefrom will be respectively known henceforth as the receiver LFSR and the receiver PRBS.

Problems with the Prior Art

One of the main problems in bit error testing is synchronizing the generator LFSR with the receiver LFSR so that the bit sequence sampled from the waveform of the test pattern $PRBS_{GEN}$ can be validly compared with the receiver PRBS $PRBS_{REC}$. Traditional approaches to solving this problem have been based on the detection of a specific pre-defined bit sequence (e.g. training pattern specified in SP14 standard) in the bit sequence sampled from a received waveform. However, this introduces the necessity of generating and including a specific bit sequence in the generator PRBS.

For the purposes of bit error testing the most straightforward method of guaranteeing a data transition at each clock edge of a deskewer is to run the generator LFSR at double the speed of the deskewer. However, whilst a generator LFSR is typically capable of running at this rate, a receiver LFSR with its additional bit sequence analysis circuitry is generally not.

The process of converting from SDR data to DDR or vice versa, normally involves multiplying or dividing the clock signal as appropriate. However, the use of a clock divider makes the process of bit error testing more difficult as it introduces phase delays that further complicate the synchronization problem.

SUMMARY OF THE INVENTION

Embodiments of the present invention is directed to the circuit, device and method as defined in the independent claims for providing a self-synchronising bit error analyser. Further embodiments of the invention are provided in the appended dependent claims.

In one embodiment, a mechanism can be provided for performing bit error testing on DDR and SDR data that avoids the necessity for an additional clock divider by using two bit selector circuit components.

In one embodiment, a mechanism is also provided for synchronizing a generator LFSR and a receiver LFSR without the requirement for the generation and inclusion of a specific pre-defined bit sequence within the generator PRBS.

Finally, one embodiment provides a mechanism for providing different testing regimens for assessing the performance of a point-to-point data transmission medium.

BRIEF DESCRIPTION OF THE DRAWINGS

An embodiment of the self-synchronising bit error testing circuit and two embodiments of the self-synchronising bit error testing device in accordance with the invention will now be described with reference to the accompanying drawings in which.

DETAILED DESCRIPTION OF THE INVENTION

The following description will discuss the following topics:

(a) a self-synchronising bit error testing circuit capable of handling SDR and DDR data; and (b) a self-synchronising bit error testing device employing the self-synchronising bit error testing circuit.

A. General Purpose Self-Synchronising Bit Error Testing Circuit

1. Hardware Architecture (i) Overview

The self-synchronising bit error testing circuit provides a mechanism for testing the re-alignment and bit recovery function of a deskewer configured for either DDR (double data rate) or SDR (single data rate) data. The following description employs the specific example of 64-bit self-synchronising bit error testing circuit used for testing the performance of a data bus comprising thirty two data lines, wherein each data line is 2-bits wide. However, it will be appreciated that the self-synchronising bit error testing circuit is not limited to this specific example and could in fact be used to assess the integrity of data transmission through any point to point transmission medium.

Figure 1:
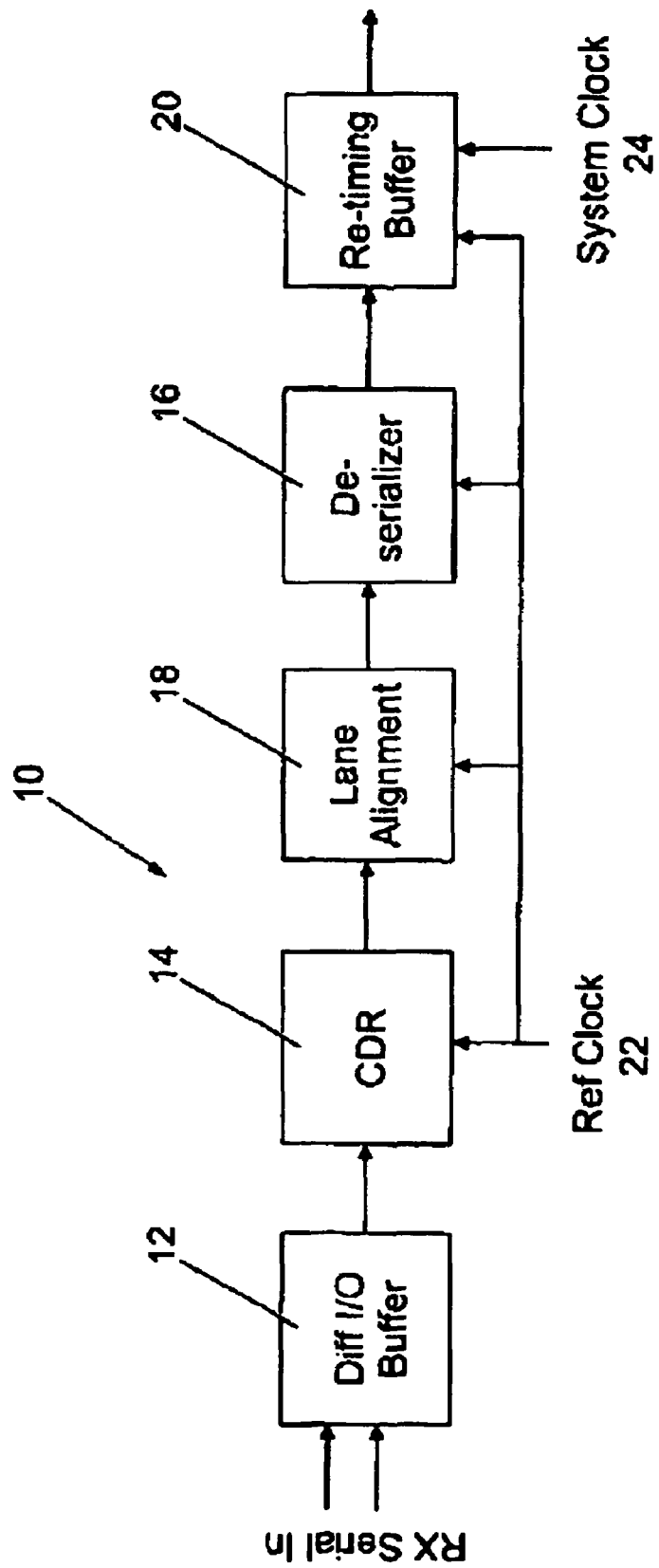
FIG. 1 is a block diagram of a typical receiver in a hybrid parallel-serial interface.
Figure 2:
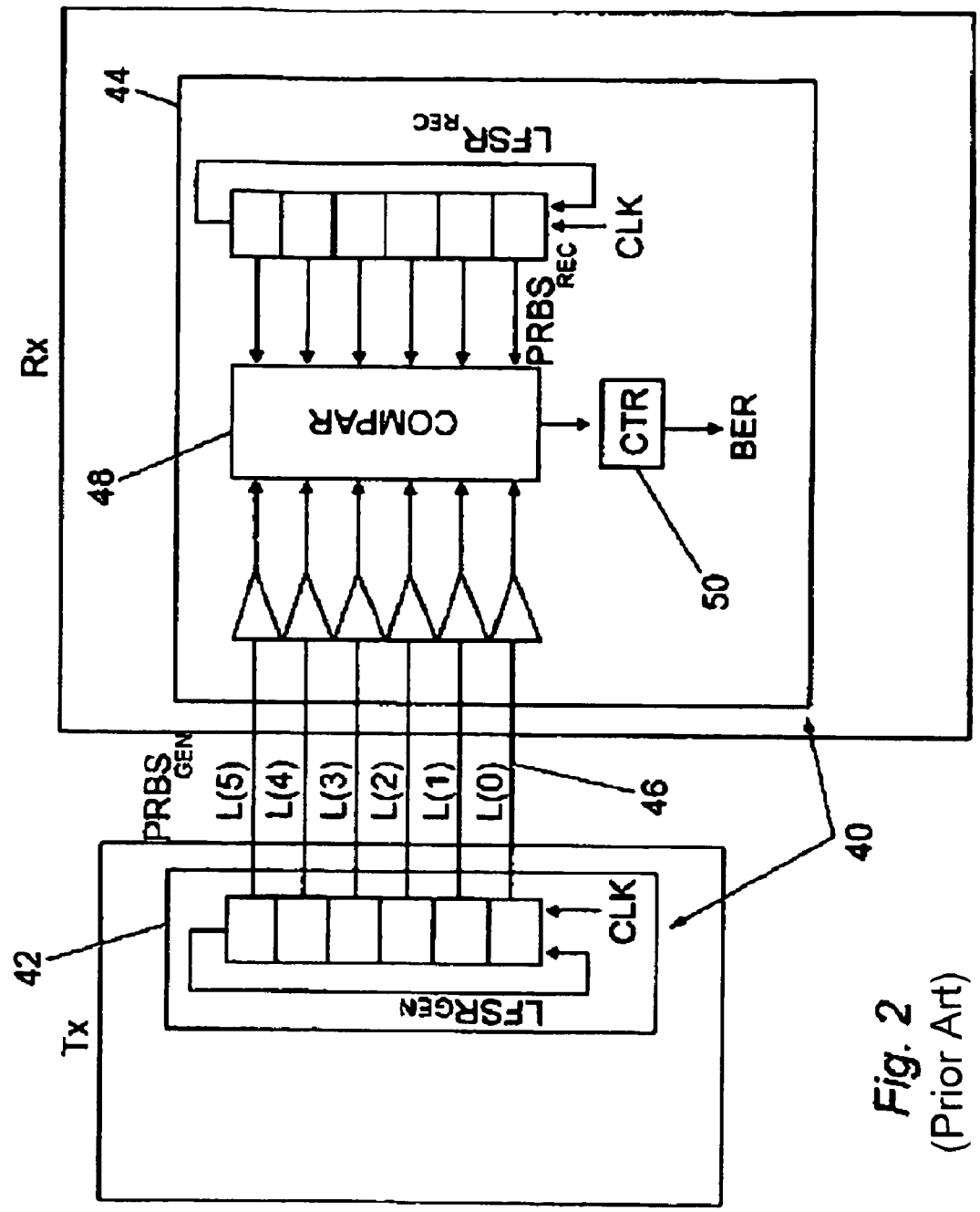
FIG. 2 is a block diagram of a typical bit error testing device.
Figure 3:
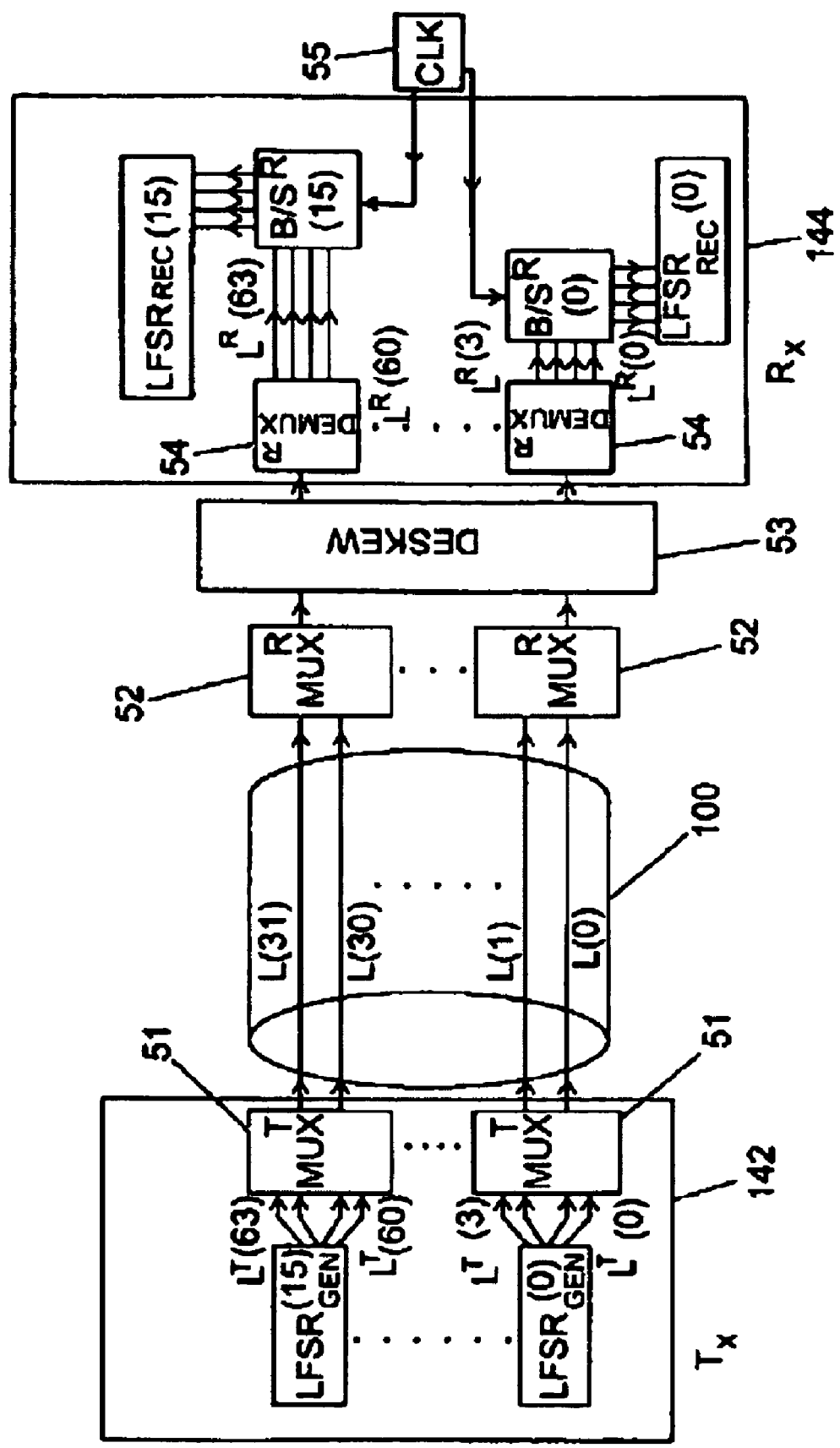
FIG. 3 is a block diagram of a 64-bit self-synchronising bit error testing circuit in accordance with the invention, testing a hybrid parallel-serial high speed data bus comprising fifteen 2-bit wide data lines.

Referring to FIG. 3, a transmitter $T_x$ and a receiver $R_x$ are connected by a data bus 100 comprising fifteen 2-bit wide data lines L(0) to L(31). For the sake of clarity, the data lines and circuit elements on the transmitter side of the data bus 100 will be henceforth designated by a 'T' superscript and the data lines and circuit elements on the receiver side of the data buses will be designated by a 'R' superscript. Communications between the transmitter $T_x$, receiver $R_x$ and data lines L(0) to L(31) are facilitated by multiplexers $MUX^T$ 51 and $MUX^R$ 52 and de-multiplexers $DEMUX^R$(54).

The generator module 142 of the self-synchronising bit error testing circuit comprises sixteen identical 12-bit LFSRs (namely $LFSR_{GEN}(0)$ to $LFSR_{GEN}(15)$) operating in parallel. The receiver module 144 of the self-synchronising bit error testing circuit comprises sixteen corresponding identical 12-bit LFSRs (namely $LFSR_{REC}(0)$ to $LFSR_{REC}(15)$). The receiver module 144 of the self-synchronising bit error testing circuit also comprises sixteen bit samplers (namely $B/S^R(0)$ to $B/S^R(15)$) controlled by a system clock 55. For the sake of simplicity the operation of the self-synchronising bit error testing circuit will be described in terms of the testing operations on two of the 2-bit data lines (L(0) to L(31)). However, it will be realized that, in practice, the testing operations described below would be simultaneously performed on all fifteen of the 2-bit data lines.

Take for example the generator LFSR $LFSR_{GEN(0)}$. in use, the generator LFSR $LFSR_{GEN(0)}$ transmits four bits from a PRBS onto data lines $L^T(0)$ to $L^T(3)$. The four bits are then transmitted to a 2:1 multiplexer $MUX^T$ and formed into bit pairs. The bit pairs are then loaded onto each of the 2-bit wide lines L(0) and L(1). The two bit pairs are transmitted to bit recovery circuits (not shown) and a receiver multiplexer MUX$^R$(52). The receiver multiplexers MUX$^R$ operate at a 2:1 rate for high-speed data and 4:1 for low speed data (in which case the data are not multiplexed by MUX$^T$ or block 51).

The data from the receiver multiplexer MUX$^R$52 are transmitted to a deskewer core device (SPI4) 53 that re-aligns the data streams received from each of the receiver multiplexer MUX$^R$ associated with each of the data lines L(0) to L(31). The re-aligned data from the first two data lines (L(0) and L(1)) are transmitted to a 1:4 demultiplexer DEMUX$^R$ and the four resulting bits are then transmitted along data lines L$^R$(0) to L$^R$(3) to the bit sampler B/S$^R$(0).

Every two cycles of the system clock 55, the bit selector B/S$^{R(0)}$ selects four bits from data line L(0,1) and transmits it to the receiver LFSR LFSR$_{REC(0)}$ for use in testing the synchronization of the generator LFSR and the receiver LFSR. Otherwise, the data from the bit selector B/SR(0) are transmitted directly to a comparator (not shown) for use in determining the bit error rate of the data line (L(0,1)) in accordance with the previously described traditional methods of bit error testing.

Figure 4:
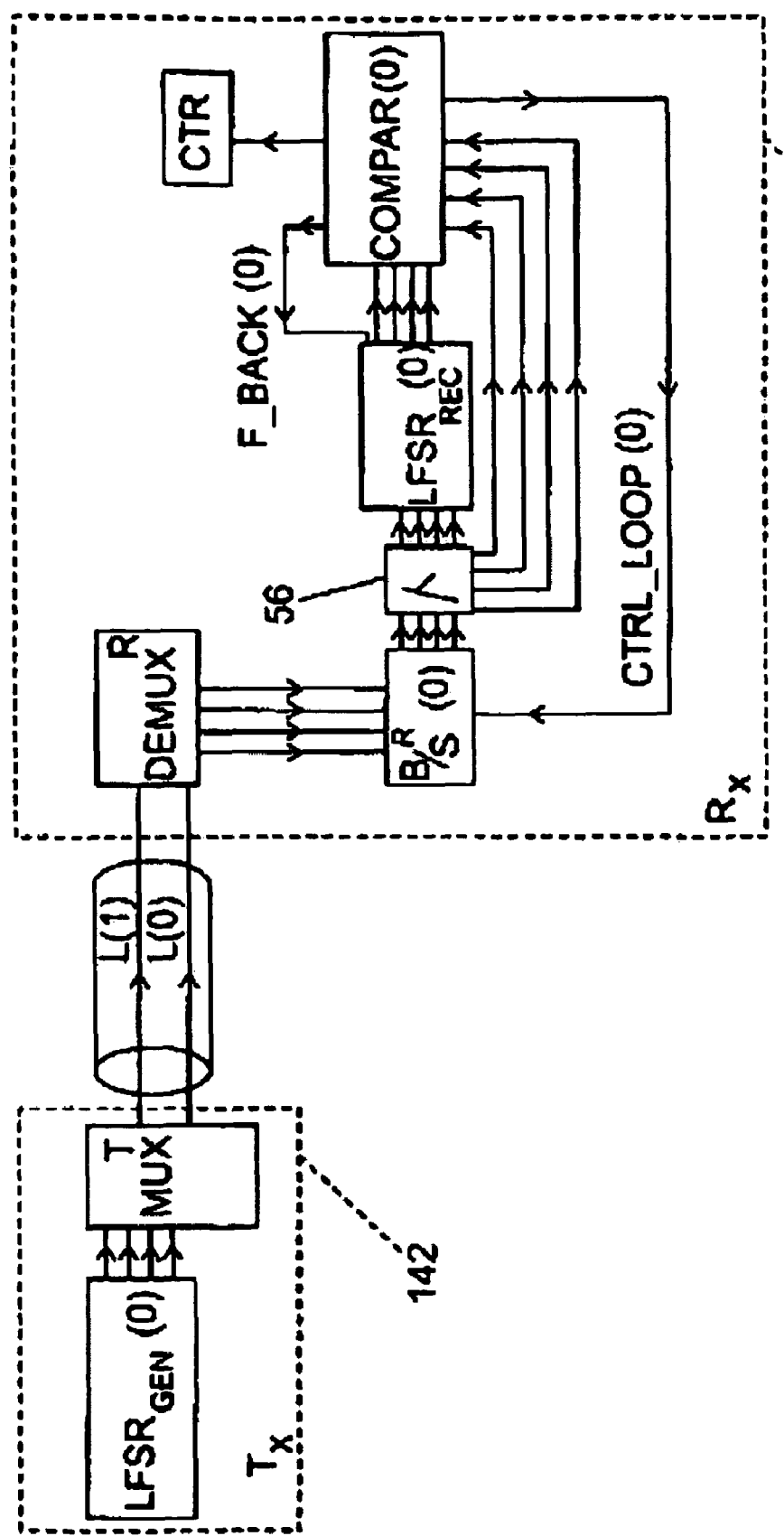
FIG. 4 is a block diagram of the components of the self-synchronising bit error testing circuit shown in FIG. 3 employed in testing the performance of a pair of the 2-bit wide data lines from the data bus shown in FIG. 3.

FIG. 4 shows the components of the self-synchronising bit error testing circuit employed in testing the pair of data lines L(0) and L(1) in more detail. In particular, the receiver module 144 comprises a switch 56, which switches the output of the bit selector B/S$^R$(0) to the receiver LFSR LFSR$_{REC}$ to thereby load the receiver LFSR LFSR$_{REC}$ at the start of the synchronization procedure. Thereafter, the switch 56 switches the output of the bit selector B/S$^R$(0) to the comparator COMPAR(0) that compares the four bits received from the bit selector B/S$^R$(0) with four bits from the output of the receiver LFSR LFSR$_{REC}$.

The phase of the receiver LFSR LFSR$_{REC}$ is altered in accordance with the feedback loop F_BACK(0). If the receiver LFSR LFSR$_{REC}$ is not synchronized with the generator LFSR$_{GEN}$, a new synchronization is tried by selecting another four bits from the bit selector B/S$^R$(0) under the control of control loop CTRL_LOOP(0). The process is repeated until a synchronization is verified fifteen times. Only four trials at maximum are required to select the correct four bits.

(ii) Signal Timing

Figure 5:
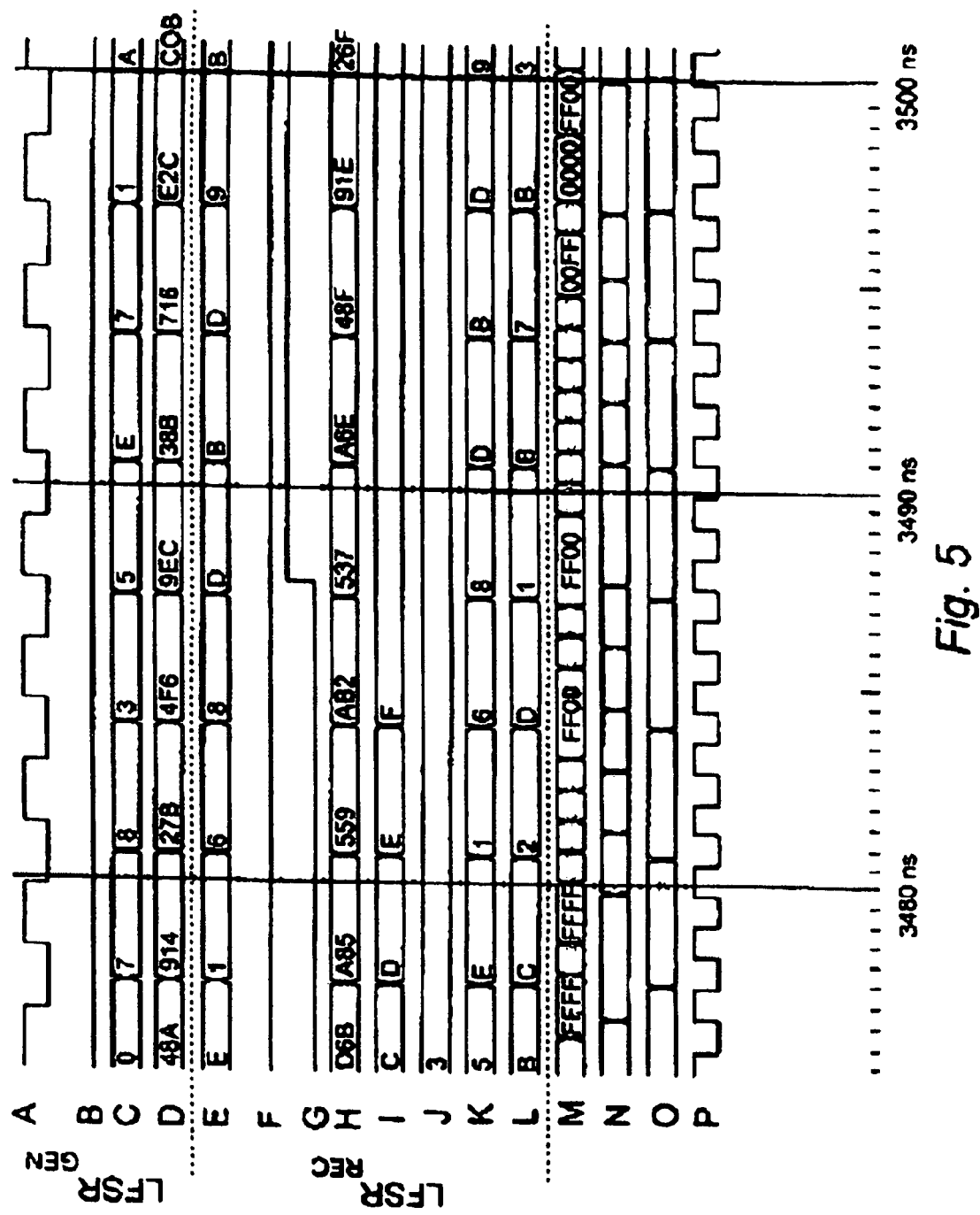
FIG. 5 is a DDR signal-timing diagram for the self-synchronising bit error testing circuit shown in FIG. 3.
Figure 6:
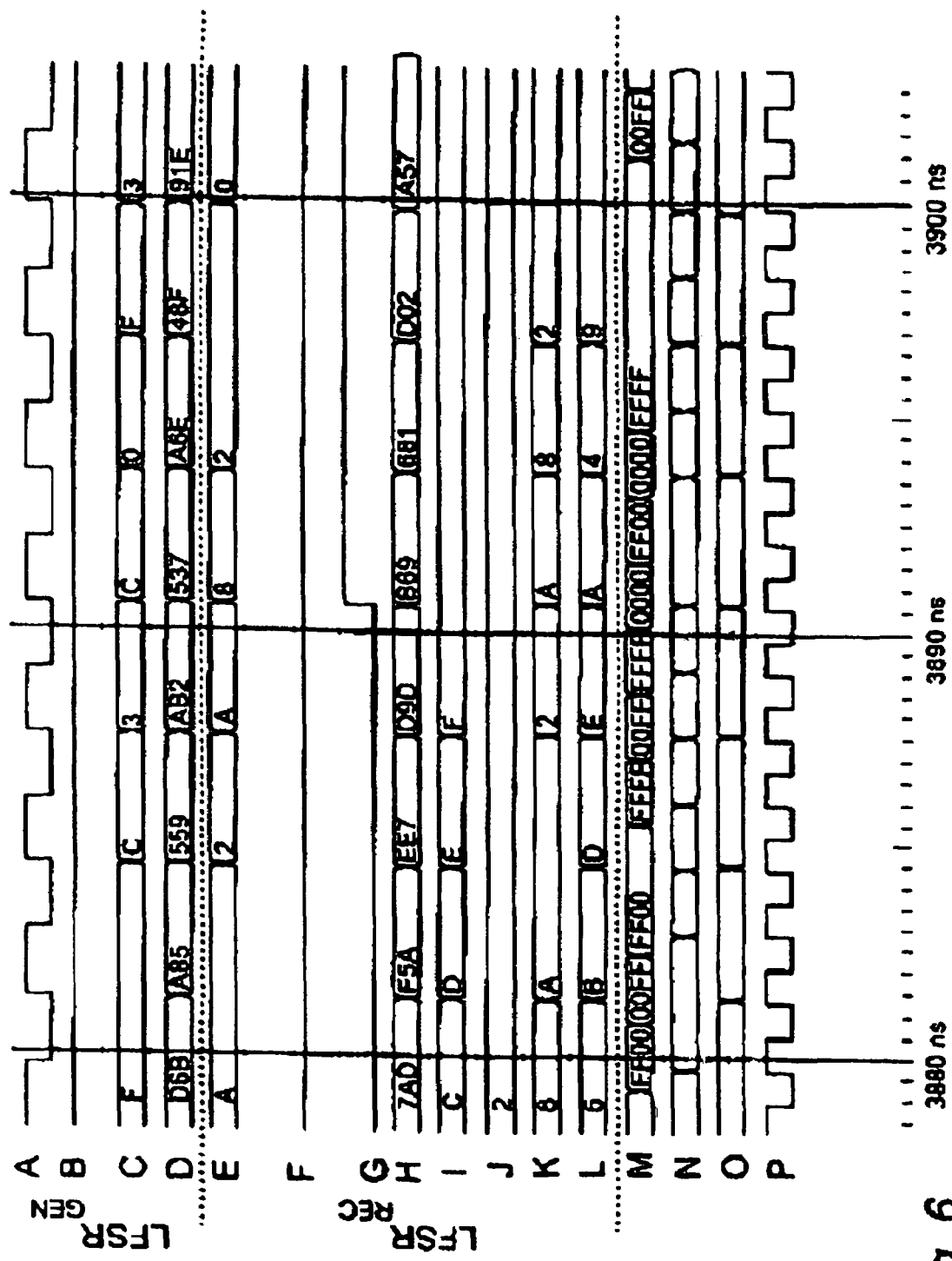
FIG. 6 is a SDR signal-timing diagram for the self-synchronising bit error testing circuit shown in FIG. 3.

The timing of the signals (SDR and DDR) transmitted in the self-synchronizing bit error testing circuit are shown more clearly in FIGS. 5 and 6 in which traces A-D show the generator LFSR control and output signals; traces E-L show the receiver LFSR control and output signals; and traces M-P show the main deskew core signals. More particularly:

Generator LFSR Control and Output Signals

Trace A: shows the generator LFSR clock running at half the speed of the deskew core;

Trace B: shows the SDR/DDR control signals for the transmitter T$_x$;

Trace C: shows a 4-bit selection from the generator PRBS PRBS$_{GEN}$; and

Trace D: shows the 12-bits of the generator LFSR LFSR$_{GEN}$ register (in hexadecimal format).

Receiver LFSR Control and Output Signals

Trace E: shows 4-bits of data sampled from the generator PRBS;

Trace F: shows the SDR/DDR control signals for the receiver R$_x$;

Trace G: shows the check state;

Trace H: shows the 12-bits of the receiver LFSR LFSR$_{REC}$ register (in hexadecimal format);

Trace I: shows the receiver 4-bit counter (in hexadecimal format);

Trace J: shows a bit selector incrementer (in unsigned format);

Trace K: shows the latched data in the data bus (in hexadecimal format); and

Trace L: shows the selected nibble received by the receiver LFSR (in hexadecimal format).

Main Deskew Core Signals

Trace M: shows the 16 bit data bus (in hexadecimal format);

Trace N: shows the data (in hexadecimal format) on the data bus comprising thirty two 2-bit wide data lines;

Trace O: shows the entire data-set transmitted through the 64-bit self-synchronizing bit error testing circuit (in hexadecimal format); and Trace P: shows the deskew core system clock.

It should be noted that when the data bus and self-synchronizing bit error testing circuit are operating at high speed, the data to be tested are transmitted at twice the speed of the generator and receiver LFSRs. Consequently, only the first 32 low bits from the data bus are used and the remaining 32 bits are set at zero.

When operating at a low speed the data to be tested are transmitted at the same speed as the receiver and generator LFSRs. Accordingly, the data to be tested is not multiplexed and the entire capacity of the bus (i.e. the entire 64 bits) is used.

(iii) LFSR Configuration

Figure 7:
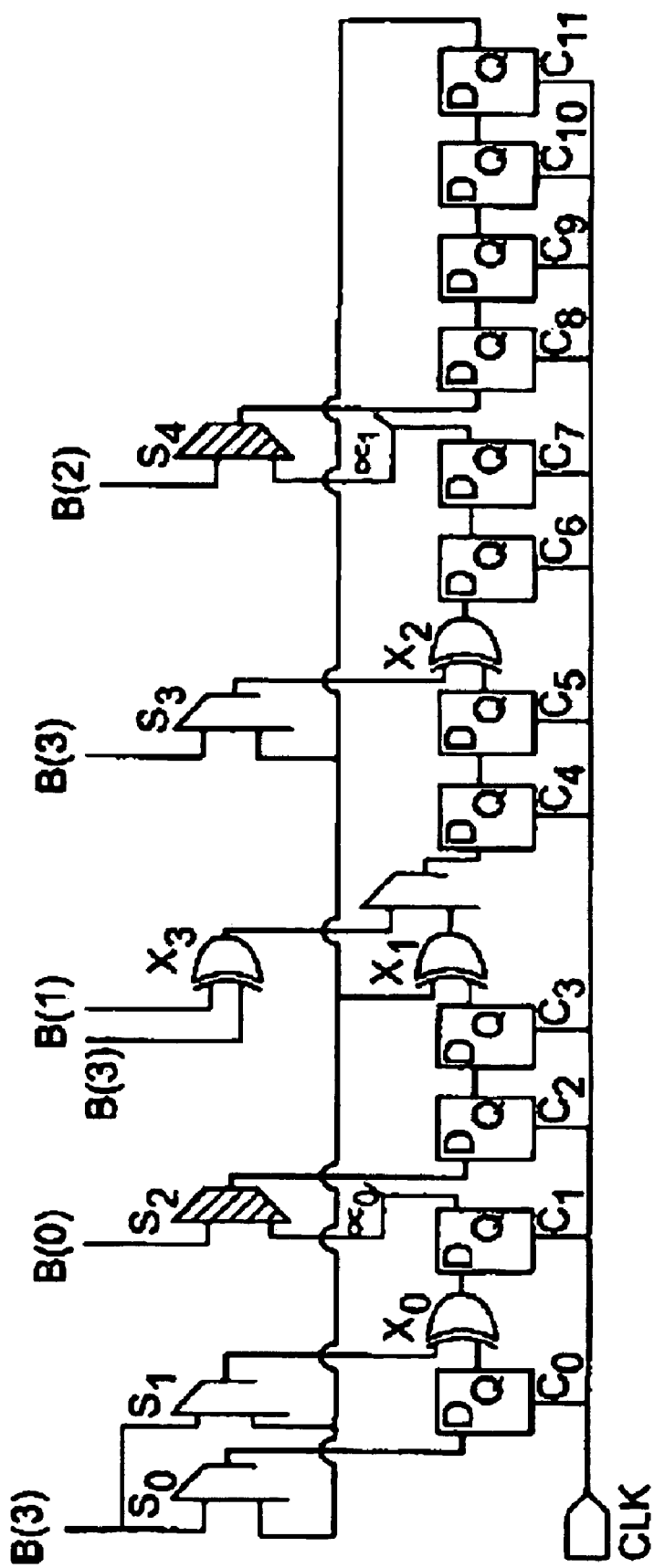
FIG. 7 is a circuit diagram of one of the LFSRs employed in the self-synchronising bit error testing circuit shown in FIG. 3.

The same 12-bit LFSR circuit is employed in the generator module and the receiver module of the self-synchronizing bit error testing circuit. The LFSR was chosen to be 12 bits in length to ensure that enough patterns were generated to enable both SDR and DDR data to be analyzed. In particular, a 12-bit LFSR generates 4095 pseudo-random patterns. FIG. 7 shows the LFSR employed in the generator and receiver modules of the self-synchronising bit error tester and the mechanism by which the generator/receiver LFSR handles SDR and DDR data.

The bottom of FIG. 7 shows all the cells ($C_0$-$C_{11}$) of the 12-bit LFSR. A switch $DC_0$ is provided between cells $C_1$ and $C_2$ and a further switch $DC_1$ is provided between cells $C_7$ and $C_8$.

As previously discussed, when synchronizing a receiver LFSR with a generator LFSR, a 4-bit selection is made from output of the deskwer in the receiver $R_x$. These four bits are shown at the top of FIG. 7 as bits B(0) to B(3) and are connected to the LFSR cells by selectors $S_0$ to $S_4$.

Normally a 12-bit LFSR has a 'tap' at cells $C_0$, $C_3$, $C_5$ and $C_{11}$. However, in order to avoid loading a zero value into the LFSR, the tap at cell $C_{11}$ is skipped and an XOR is introduced only at cells $C_0$, $C_3$, $C_5$ (shown as $X_0$, $X_3$, and $X_5$ respectively). The output from cell $C_{11}$ is employed in a feedback structure to cells $C_0$, $C_1$ (through XOR gate $X_0$), $C_4$ (through XOR gate $X_1$) and $C_6$ (through XOR gate $X_2$).

The one-to-many feedback structure enables the LFSR to operate at a higher clock speed than a 'many-to-one' feedback structure.

2. Operation

Figure 8:
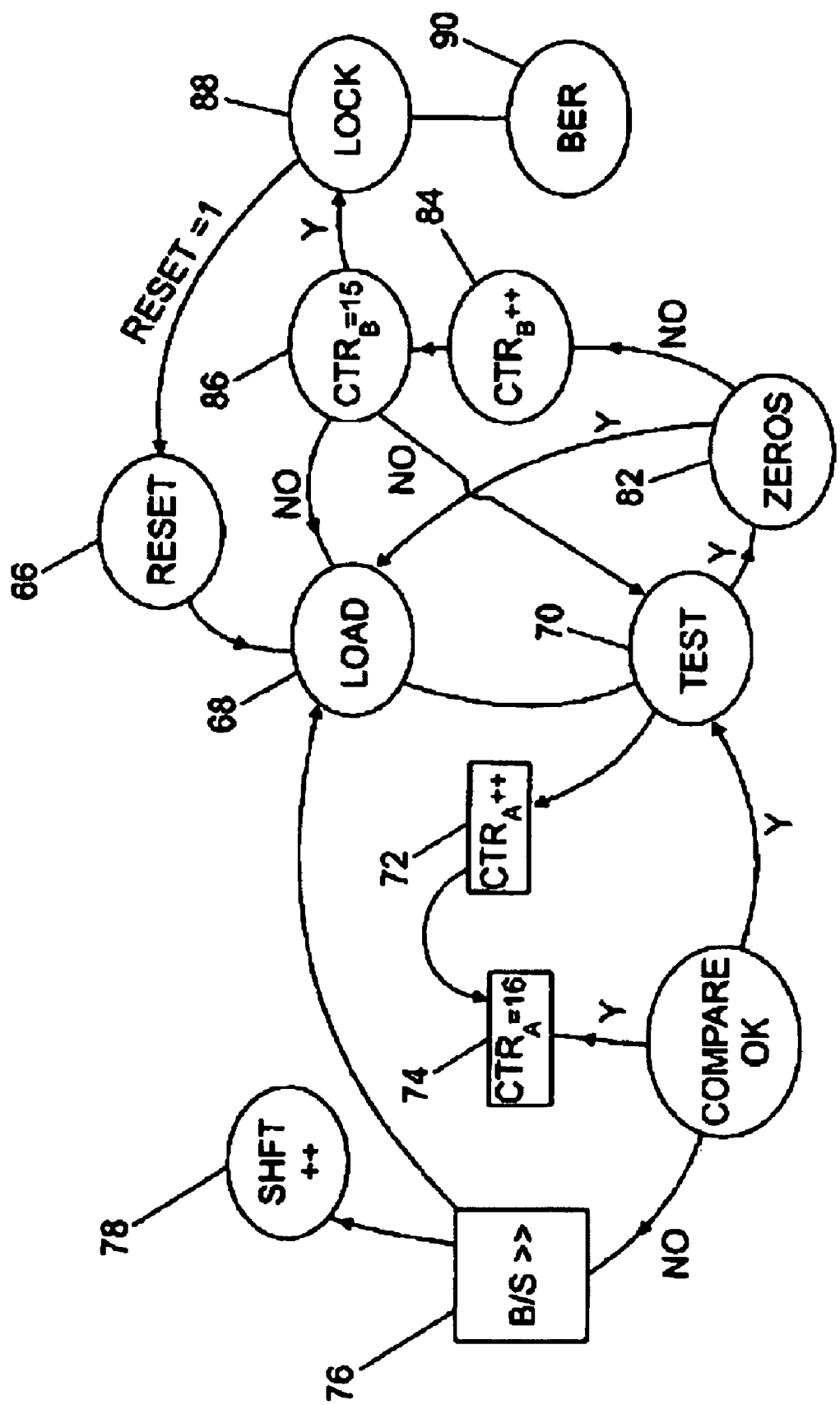
FIG. 8 is a state diagram of the self-synchronising bit error testing circuit shown in FIG. 3.

FIG. 8 shows the operation of the self-synchronizing bit error testing circuit in more detail. In a first step (RESET 66) the receiver LFSR is reset. In the next step (LOAD 68), the receiver LFSR is loaded with the data received from the generator LFSR.

Returning for a moment to FIG. 7, when loading data into the receiver LFSR, the feedback signal to the LFSR cells is not the output from cell $C_{11}$. Instead, the LFSR feedback is the input data bit B(3).

When receiving DDR data, the switches $DC_0$ and $DC_1$ are maintained in an open state and data from the receiver deskewer is loaded into the LFSR via the selectors at cells $C_0$, $C_1$, $C_2$, $C_4$, $C_6$ and $C_8$. A further XOR logic gate (namely $X_3$) is provided at the input to LFSR cell $C_4$. Consequently, the input to cell $C_4$ is bit B(3) XOR bit B(1).

As will be recalled, the same LFSR is employed for SDR and DDR data. For SDR data only two bits from the 4-bit selection from the receiver deskewer are loaded into the LFSR. In particular, bits B(0) and B(2) are not loaded into the LFSR. This is achieved by closing switches $DC_0$ and $DC_1$ so that cell $C_1$ is directly connected to cell $C_2$ and cell $C_7$ is directly connected to cell $C_8$. This enables the input to cells $C_2$ and $C_8$ to bypass selectors $S_2$ and $S_4$ respectively.

By choosing adequately separated bits (bits 1, 3, 7 and 11) instead of consecutive bits from an LFSR it is possible to run the LFSR at half the speed of the deskewer and still have DDR (double data rate) data at the input and/or output of the deskewer. Furthermore it is possible to create SDR data by taking only two bits from the LFSR and repeating those (bits 3, 3, 11 and 11) with no clock division.

Returning to FIG. 8, once data is loaded into the receiver LFSR, the self-synchronizing bit error testing circuit performs a TEST step 70 (if the COMPARE is successful) in which a confirmation pattern is generated by the receiver LFSR by switching its multiplexers into feedback mode and inserting taps (at cells $C_0$, $C_3$ and $C_5$) into the feedback line. The confirmation pattern is then compared against the generator PRBS pattern received by the receiver.

If the confirmation pattern does not match the received generator PRBS pattern, the self-synchronizing bit error testing circuit returns to the LOAD step 68 and loads a further 4-bit selection from the generator PRBS pattern into the receiver LFSR. The TEST step 70 is repeated using the updated 4-bit selection.

The LOAD step 68 and TEST step 70 are repeated until a phase lock is achieved between the confirmation pattern and the received generator PRBS pattern. With each cycle of the LOAD 68 and TEST 70 operations a counter $CTR_A$ is incremented $CTR_A$++72.

If a match is not achieved between the confirmation pattern and the received generator PRBS within 16 cycles of the LOAD 68/TEST 70 operations ($CTR_A$=16, 74), the input data is shifted by one position to the right (B/S>>76), a bit shift counter is incremented (SHFT++78) and the LOAD 68/TEST 70 operations are repeated until a match is detected between a received generator PRBS pattern and a confirmation PRBS pattern.

Once a valid phase lock has been achieved (i.e. a match is achieved between a confirmation PRBS pattern and a received generator PRBS pattern) a check is performed to ensure that the output from the receiver LFSR does not solely comprise zeros (ZEROS 82) (i.e. there is no data in the input data stream). If the receiver LFSR output does solely comprise zeros, the state machine returns to the LOAD state 68.

If a valid phase lock has been achieved and the output from the receiver LFSR does not solely comprise zeros, a further counter is incremented ($Ctr_B$++84) (noting of course that $CTR_B$ may equal $CTR_A$). In particular, the phase lock must be validated fifteen times to ensure the correct synchronization of the generator and receiver LFSRs. If the phase lock has been validated fifteen times ($CTR_B$=15, 86) the receiver and generator LFSRs are deemed to be synchronized and the relative timing of the receiver and generator LFSRs is locked (i.e. LOCK state 88). Once the locked state (LOCK 88) has been attained, it can only be left by a reset (RESET 66).

Figure 9:
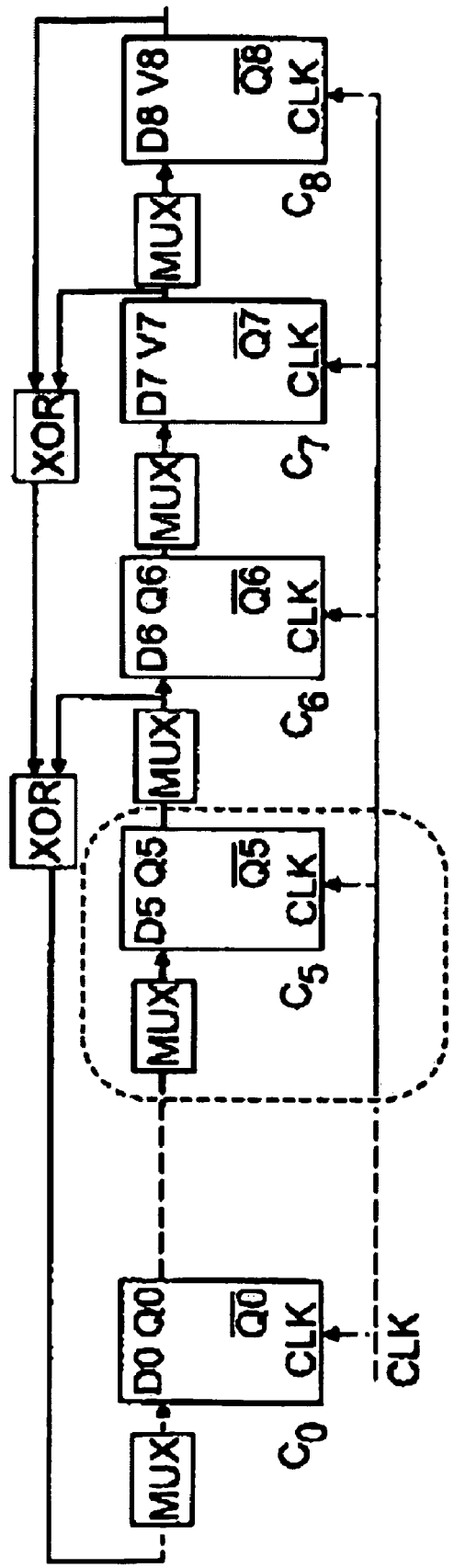
FIG. 9 is a block diagram of a first embodiment of the self-synchronising bit error testing device comprising the self-synchronising bit error testing circuit shown in FIG. 3.

When the self-synchronizing bit error testing circuit has attained the locked state the generator LFSR and the receiver LFSR is allowed to run continuously. At each cycle the generator PRBS is compared to the receiver PRBS. When an error is detected, a counter (not shown) is incremented which allows a bit error rate (BER 90) to be computed in accordance with the traditional methods of BER testing. The VHDL code for the BER testing operations is shown below: TABLE-US-00001 checking_ok<='1' WHEN LFSR_Reg(11) & LFSR_Reg(7) & LFSR_Reg(3) & LFSR_Reg(1)=selectedbyte ELSE '0';

The VHDL code for performing the above-described synchronization process by the bit selector is shown below. Since a data transition can start anywhere within the 4-bit selection loaded into the receiver LFSR, a small two-stage buffer composed of the input data bus and the latched data bus (datain_del bus) is used to make a new estimate of the position of crossing over points in the received data stream every 16 cycles (i.e. when the bit selector is changed) until a match is found between the selected digits and the data generated by the receiver LFSR. For instance at the start of a received waveform, with a bit selector at 3, dat=x'1' and datain_del=x'E', the selected byte (in fact digit) is equal to x'C'. TABLE-US-00002 sel_c: PROCESS (dat, datain_del, bitselector, lfsr_reg) BEGIN IF (sdr='0') THEN /* Double data rate, all the bus is taken as is */ CASE bitselector IS WHEN "00"=>selectedbyte<=dat; WHEN "01"=>selectedbyte<=datain_del(0) & dat(3 DOWNTO 1); WHEN "10"=>selectedbyte<=datain_del(1 DOWNTO 0) & dat(3 DOWNTO 2); WHEN "11"=>selectedbyte<=datain_del(2 DOWNTO 0) & dat(3); WHEN OTHERS=>NULL; END CASE; ELSE /* Single data rate, only 2 bits are taken, */ /* and the others are taken from the LFSR */ CASE bitselector IS WHEN "00"=>selectedbyte<=dat(3) & lfsr_reg(7) & dat(1) & lfsr_reg(1); WHEN "01"=>selectedbyte<=datain_del(0) & lfsr_reg(7) & dat(2) & lfsr_reg(1); WHEN "10"=>selectedbyte<=datain_del(1) & lfsr_reg(7) & dat(3) & lfsr_reg(1); WHEN "11"=>selectedbyte<=datain_del(2) & lfsr_reg(7) & datain_del(0) & lfsr_reg(1); WHEN OTHERS=>NULL; END CASE;

B. Self-Synchronising Bit Error Testing Device Employing the Self-Synchronising Bit Error Testing Circuit 1. Circuit Hardware Architecture FIG. 9 shows a 9-bit LFSR circuit for use in the bit error testing device, in which the outputs from cells $C_5$ and $C_7$ are employed in the feedback loop to latch $C_0$. However, it will be appreciated that the invention is not limited to this specific example and could instead embrace LFSRs of other lengths with different feedback connections.

If the data bus is a 9 bit BUS (for instance 1 byte and its parity), then a simple schematic to load the receiver LFSR would be to load all bits of the data bus. In this case no bit selector and no finite state machine with the LOAD, VALID, LOCK states is needed but the generator and receiver LFSRs must run at the same speed as the device under test.

Figure 10:
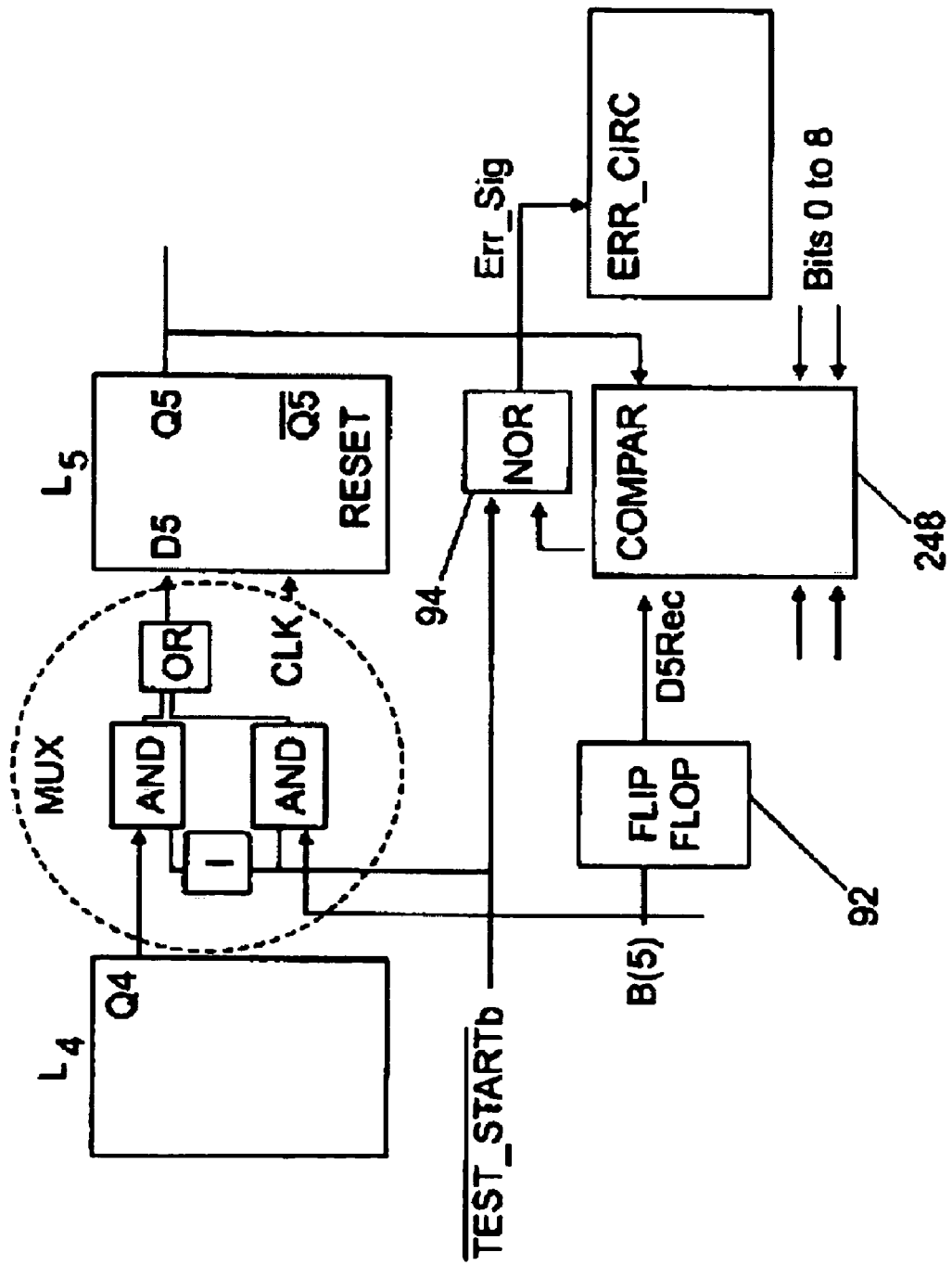
FIG. 10 is a detailed view of the fifth and sixth cells of the LFSR employed in the first embodiment of the self-synchronising bit error testing device shown in FIG. 9.

The operation of the bit error testing devices will be described in more detail with reference to the operations of one of the cells (e.g. cell $C_5$) shown in FIG. 9. To this end, FIG. 10 shows a more detailed view of the circuit components between cell $C_4$ and cell $C_5$.

The input multiplexer MUX between cells $C_4$ and $C_5$ comprise a network of AND and OR logic gates arranged to multiplex the output from cell $C_4$ (i.e. Q4) with the sixth bit B(5) received from the data bus connecting the receiver and transmitter.

The sixth bit B(5) is also transmitted to a D-type flip-flop 92 the output (D5rec) of which is transmitted to comparator 248. The comparator 248 compares D5rec with the output $Q_5$ of cell $C_5$. The results of this comparison are combined with a control signal TEST_START$_b$ by way of a NOR logic gate 94 to produce an error signal Err_Sig that is used to control the operation of an error management circuit ERR_CIRC.

2. Operational Phases

Figure 11:
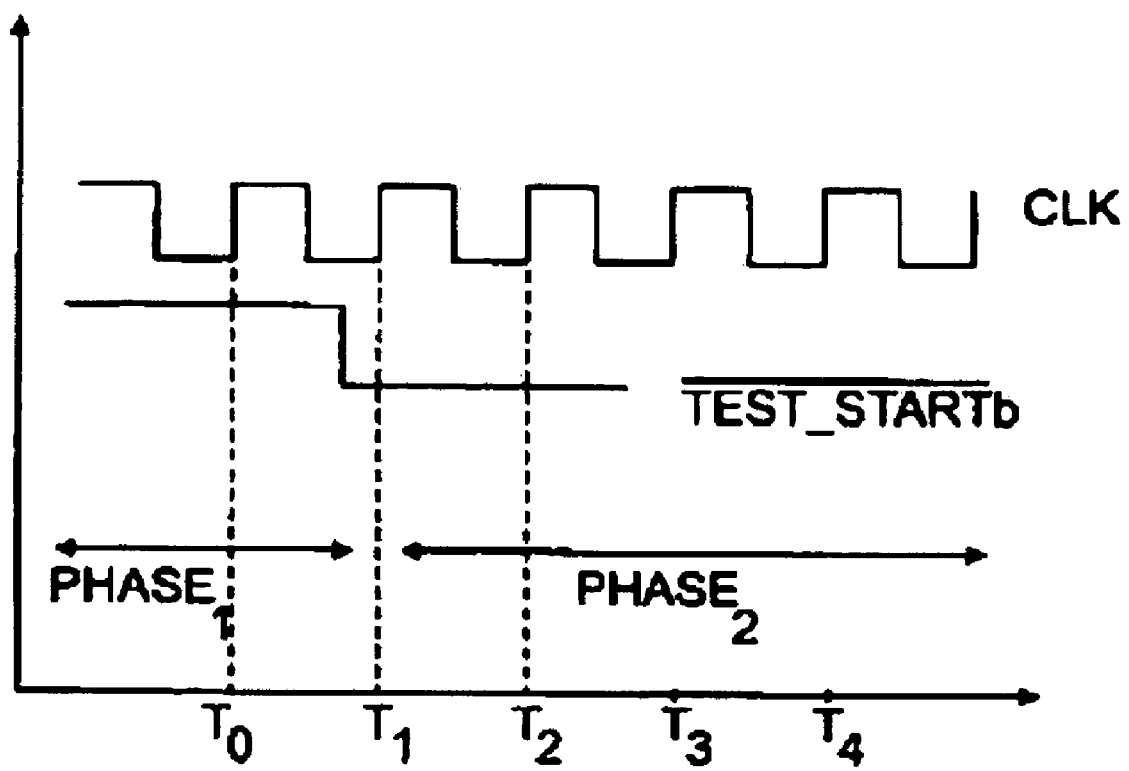
FIG. 11 is a timing diagram of the control signals and operational phases of the first embodiment of the self-synchronising bit error testing device shown in FIG. 9.

In use, the circuit operates in two phases, namely a no test phase and a verification phase. Both of these operational phases will be described in more detail below by referring to FIG. 10 together with the signals shown in FIG. 11.

Phase 1: No test (Time Period $T_0$ to $T_1$)

Before the TEST_STARTb signal becomes active all the data coming from the receiver are latched into the register at the same time.

Consequently, when the output $Q_5$ from cell $C_5$ is compared with the D5rec signal both of the signals have the same value.

Phase 2: Verification

When the TEST_START$_b$ signal becomes active, the cells $C_0$ to $C_8$ are connected in series. On the next clock cycle the output Q5 of the cell $C_5$ is compared to the output D5rec of the flip-flop 92, which is equal to the sixth bit B(5).

Since the generator LFSR and the receiver LFSR are now operating independently of each other the synchronization made at time $T_1$ enables the detection of any differences between the outputs of the LFSRs that indicates lost data.

3. Error Management Circuit (ERR_CIRC)

The error management circuit receives an error signal from the comparator 248 and is used for correcting a single bit error occurring along the length of the receiver LFSR. The error management circuit also enables the receiver LFSR to be stopped and restarted on detection of a bit error so that the bit error can be loaded in a counter and the BER incremented.

C. Multiple LFSR Self-Synchronizing Bit Error Testing Device

1. Hardware Architecture

Figure 12:
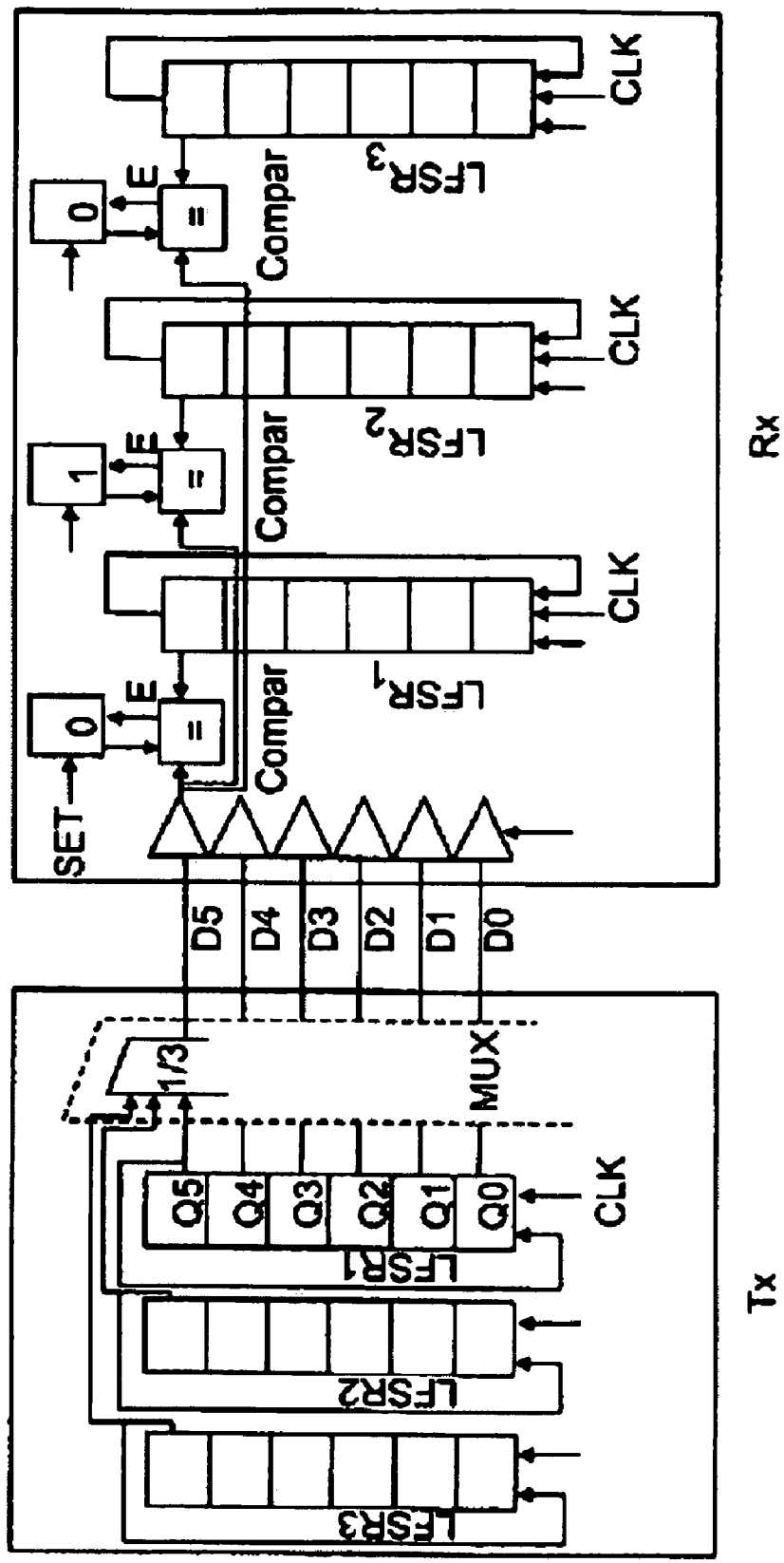
FIG. 12 is a block diagram of a second embodiment of the self-synchronising bit error testing device employing multiple generator and receiver LFSRs.
Figure 13:
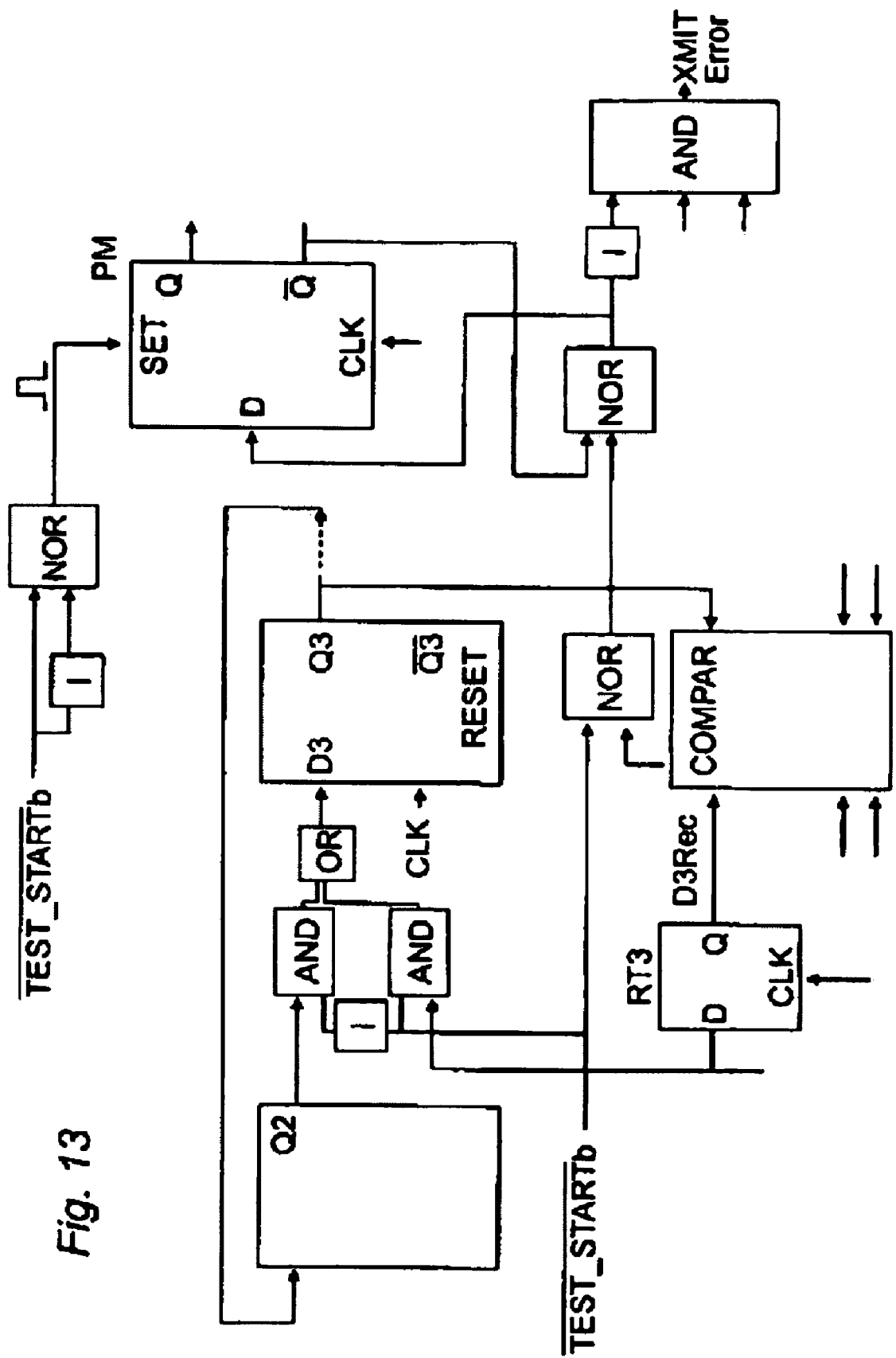
FIG. 13 is a more detailed view of the third and fourth LFSRs (receiver or generator) of the second embodiment of the self-synchronising bit error testing device shown in FIG. 12.

The generator module and the receiver module in the above-described bit error testing device include a single generator LFSR and a single receiver LFSR respectively. However, the bit error testing functionality of the bit error testing device can be enhanced by the generation of multiple test patterns to provide a more comprehensive testing regime. In particular, referring to FIG. 12, a generator module includes a PRBS generator comprised of several LFSRs of different configuration and length. In a given verification phase, any one of the LFSRs may be selected by a multiplexor MUX. In the event that a generator module contains only a single LFSR, the configuration of the LFSR may be altered by changing its XOR connections.

In the case of a generator module containing multiple LFSRs, the receiver module must also include several LFSRs operating in parallel to ensure that at least one of the receiver LFSRs matches the generator LFSR.

2. Operation

As in the previously described single LFSR bit error testing device, the multiple LFSR bit error testing device has two operational phases, namely the No test phase and the verification phase. Both of these operational phases will be described in more detail below by referring to FIG. 12 together with the signal timing diagram in FIG. 11.

Phase 1: No Test Phase

During the No Test Phase (i.e. before the TEST-STARTb control signal becomes active), no error checking is effectively performed since all the generator and receiver LFSRs are loaded with the same value in accordance with the data present on the data bus.

Phase 2: Verification Phase

At time $T_1$ the control signal TEST_STARTb becomes active and all the LFSRs are isolated from the value on the data bus and start to run in LFSR mode. Each LFSR has an additional register PM (pattern matching) that is set to one at time $T_1$. The output of the PM register returns to zero if there is a mismatch between the transmitted generator PRBS and the receiver PRBS. If after a few clock cycles any one of the PM registers contains a '1' value the corresponding receiver LFSR is deemed to match the generator LFSR and BER determination becomes possible. However, in the event that one the PM registers contain a '0' value a failure is deemed to have occurred and the system is reset.

It will be recognized that it is possible to use different transmitter LFSRs during different test cycles $T_i$ to $T_{i+1}$ (i>1) and thereby provide comprehensive testing on the fly.

Whilst the discussions so far have focused on the use of the self-synchronising bit error testing circuit and device for testing computer data buses, it will be appreciated that the self-synchronising bit error-testing device could be used, with minor modifications, to assess the performance of any point-to-point digital transmission medium.

Modifications and alterations may be made to the above without departing from the scope of the invention.

The invention claimed is:

1. A self-synchronizing data bus analyser comprising
   a generator LFSR to generate a first data set;
   a receiver LFSR to generate a second data set;
   a bit sampler to sample the first data set received through a data bus coupled to the generator LFSR and output a sampled first data set; and
   a comparator to compare the sampled first data set with the second data set generated by the receiver LFSR and provide a signal to the receiver LFSR to adjust a phase of the receiver LFSR until the second data set is substantially the same as the first data set.

2. The self-synchronizing data bus analyzer as claimed in claim 1 wherein the receiver LFSR comprises a plurality of cells which are adjustable by right shifting.

3. The self-synchronizing data bus analyzer as claimed in claim 1 wherein the generator LFSR is operable to generate a third data set which is loaded into the cells of the receiver LFSR before the receiver LFSR generates the second data set for comparison with the sampled first data set.

4. The self-synchronizing data bus analyzer as claimed in claim 1 wherein, after a match has been achieved between the sampled first data set and the second data set, a control loop can cause the generator LFSR to generate a fourth data set for comparison with a fifth data set generated by the receiver LFSR and thereby verify the synchronization of the generator and receiver LFSRs.

5. The self-synchronizing data bus analyzer as claimed in claim 1 wherein the comparator is operable to provide a signal for controlling operation of the bit sampler when adjusting the phase of the receiver LFSR.

6. The self-synchronizing data bus analyzer as claimed in claim 1, wherein the generator LFSR and the receiver LFSR are substantially identical and each of the generator LFSR and the receiver LFSR includes:
   a plurality of cells including some cells directly connected to each other and other cells;
   a plurality of bit loading units connecting adjacent ones of the other cells; and
   switches disposed between respective adjacent ones of the other cells, each of the
   switches being movable between a first closed position in which the respective bit loading unit is bypassed and the respective adjacent ones are directly connected, and a second open position in which the respective adjacent ones are connected through the respective bit loading unit.

7. The self-synchronizing data bus analyzer as claimed in claim 6 wherein the switch is movable to the first closed position on receipt of SDR data and the second open position on receipt of DDR data.

8. The self-synchronizing data bus analyzer as claimed in claim 6 wherein a third data set is generated by the generator LFSR and loaded into the cells of the receiver LFSR before the receiver LFSR generates the second data set for comparison with the first data set.

9. The self-synchronizing data bus analyzer as claimed in claim 6 wherein a control loop causes the generator LFSR to generate a fourth data set for comparison with a fifth data set generated by the receiver LFSR to verify the synchronization of the generator and receiver LFSRs.

10. The self-synchronizing data bus analyzer as claimed in claim 6 wherein the self-synchronizing data bus analyzer comprises an error correcting unit which corrects a single bit error detected in a data sequence of the same length as the receiver or generator LFSR.

11. The self-synchronizing data bus analyzer as claimed in claim 6 wherein the self-synchronizing data bus analyzer further comprises a control unit which stops and restarts the receiver LFSR on detection of a bit error.

12. A self-synchronizing data bus analyzer, comprising:
a plurality of generator LFSRs;
a plurality of corresponding receiver LFSRs; and
a comparator,
wherein each of the generator and receiver LFSRs comprise a plurality of cells including some cells directly connected to each other and other cells, a plurality of bit loading units connecting adjacent ones of the other cells, the generator LFSRs being of differing configurations and each receiver LFSR is of substantially identical configuration to its corresponding generator LFSR;

each of the generator and receiver LFSRs including a plurality of switches disposed between respective adjacent ones of the other cells, each of the switches being movable between a first closed position in which the respective bit loading unit is bypassed and the respective adjacent ones are directly connected, and a second open position in which the respective adjacent ones are connected through the respective bit loading unit;

each of the generator LFSRs being operable to generate a first data set which is transmitted through a data bus to the comparator;

and the comparator is operable to compare a sample of each first data set with the second data set generated by the corresponding receiver LFSR and adjust phases of each of the receiver LFSRs until the second data sets are substantially the same as the corresponding samples of the first data sets.

13. The self-synchronizing data bus analyzer as claimed in claim 12 wherein each of the receiver LFSRs is provided with an indicator, which enables a suitable receiver LFSR to be identified for bit error testing the output from one of the generator LFSRs.

* * * * *